US007751576B2

(12) United States Patent
Kobayashi

(10) Patent No.: US 7,751,576 B2
(45) Date of Patent: Jul. 6, 2010

(54) LOUDSPEAKER APPARATUS

(75) Inventor: Shinji Kobayashi, Chiba (JP)

(73) Assignee: Sony Corporation (JP)

( * ) Notice: Subject to any disclaimer, the term of this patent is extended or adjusted under 35 U.S.C. 154(b) by 1239 days.

(21) Appl. No.: 11/301,391

(22) Filed: Dec. 13, 2005

(65) Prior Publication Data

US 2006/0159275 A1 Jul. 20, 2006

(30) Foreign Application Priority Data

Dec. 15, 2004 (JP) .......................... P2004-363569

(51) Int. Cl.
*H03G 3/00* (2006.01)

(52) U.S. Cl. ...................................................... 381/104

(58) Field of Classification Search ................. 381/104, 381/59, 58, 55, 98, 103, 116, 120, 107, 111, 381/109, 56, 77, 80, 106; 181/166
See application file for complete search history.

(56) References Cited

U.S. PATENT DOCUMENTS

| | | | | |
|---|---|---|---|---|
| 2,971,597 A * | 2/1961 | Gorike | ....................... | 181/166 |
| 6,359,987 B1 * | 3/2002 | Tran et al. | ..................... | 381/58 |

FOREIGN PATENT DOCUMENTS

| | | | |
|---|---|---|---|
| JP | 3077597 | | 4/1991 |
| JP | 9055995 | | 2/1997 |
| JP | 2000-023300 | * | 1/2000 |
| JP | 2002-171589 A | | 6/2002 |

OTHER PUBLICATIONS

Japanese Office Action issued on Apr. 1, 2008 in connection with corresponding Japanese Application No. JP 2004-363569 (2 pages).

* cited by examiner

*Primary Examiner*—Vivian Chin
*Assistant Examiner*—Lun-See Lao
(74) *Attorney, Agent, or Firm*—Lerner, David, Littenberg, Krumholz & Mentlik, LLP

(57) ABSTRACT

A loudspeaker apparatus has an improved reproduction characteristic of signals of small sound volumes. The loudspeaker apparatus includes a small-signal loudspeaker unit operable to output first signals in the range of a predetermined level or below of the input audio signals, with a characteristic in which the linearity of output frequency with respect to input signals is substantially secured in the range of the predetermined level or below; and a large-signal loudspeaker unit operable to output signals in the range of a predetermined level or above of the input audio signals, with a characteristic in which the linearity of output frequency with respect to input signals is substantially secured in the range of the predetermined level or above, wherein the linearity of an input-output characteristic is secured regarding both small-amplitude and large-amplitude signals.

4 Claims, 7 Drawing Sheets

LOUDSPEAKER APPARATUS

CROSS-REFERENCE TO RELATED APPLICATIONS

The present application claims priority from Japanese Patent Application No. JP 2004-363569 filed on Dec. 15, 2004, the disclosure of which is hereby incorporated by reference herein.

BACKGROUND OF THE INVENTION

The present invention relates to a loudspeaker apparatus which reproduces audio signals, particularly to a technology suitably applied to a hi-fi reproduction loudspeaker apparatus capable of high-quality sound reproduction.

A variety of constructions have been put into practical use as hi-fi reproduction loudspeaker apparatuses capable of high-quality sound reproduction. For example, there is a loudspeaker apparatus of a three-way structure in which the reproduction band of an audio signal is divided into three bands of a low band, middle band and high band and a loudspeaker unit is individually prepared for each band. This loudspeaker apparatus of a three-way structure becomes capable of accurately reproducing input audio signals from the low band to high band when using, as the above-described loudspeaker for each band, loudspeaker units with favorable reproduction characteristics in respective bands; and typically has a reproduction characteristic more improved than what is called a full-range type loudspeaker unit which outputs audio in all the bands from one loudspeaker unit.

Further, other than the above-described construction in which sound reproduced from a loudspeaker apparatus is made high-quality with a three-way structure or two-way structure, the characteristic of an audio signal itself supplied to a loudspeaker apparatus is corrected on the side of an amplifier and as a result the characteristic of audio output from the loudspeaker apparatus is improved. For example, in some cases, a correction called loudness control is carried out in an audio amplifier that executes processing such as amplification of an audio signal that drives a loudspeaker apparatus. In the loudness control is performed correction processing which makes output levels of the low sound range and the high sound range amplified compared with the middle sound range, and deficiency in the low sound range and the high sound range, which is felt mainly when the sound volume is small, is corrected.

In Published Japanese Patent Application No. 2002-171589, an example of a reproduction structure for carrying out loudness correction is described.

However, regarding reproduced sound on which the loudness control is performed, since signals in a particular frequency band are simply amplified almost uniformly regardless of a level, strictly speaking, reproduction is not performed accurately with respect to input audio signals and therefore development of a loudspeaker apparatus capable of reproducing input audio signals more accurately has been desired. Specifically, regarding reproduced sound on which a loudness control of related art is performed, since sound difficult to be listened to when the sound volume is small is amplified and reproduced, the reproduced sound becomes easy to be listened to and sound quality is improved to some extent in the low sound range and the high sound range in comparison with reproduced sound on which no loudness control is performed; however, since signals in a particular frequency band are uniformly amplified, signal components not requiring amplification may be amplified as well, as a result sound may be reproduced unnaturally.

Here, a problem when sound is reproduced in a loudspeaker apparatus of related art is explained; as an example of a case in which sound is not reproduced accurately with respect to an input audio signal, there is a problem of a small-amplitude signal. Specifically, as shown for example in FIG. 1A, a case is assumed in which an input audio signal S1 whose waveform is a continuation of a waveform of a relatively large amplitude and a waveform of a relatively small amplitude has been input to a loudspeaker. On this occasion, regarding the waveform of an output audio signal S2 from the loudspeaker, a waveform of the relatively large amplitude is almost the same as that of the input signal S1, but a waveform of the relatively small amplitude tends to be smaller in amplitude than that of the input signal S1. This is because, in a loudspeaker unit including a typical diaphragm capable of outputting a relatively large sound, the reproduction characteristic of a signal of a small sound volume having small amplitude is not excellent and so linearity in the input-output characteristic of a signal of a small sound volume is not secured.

Similarly, as shown for example in FIG. 1B, when an input audio signal S3 whose waveform is relatively large in amplitude and an input audio signal S4 whose waveform is relatively small in amplitude overlap temporally, originally both the signals S3 and S4 are combined to be output as an audio signal S5, however, in actuality an output audio signal S6 whose waveform has a level lower than that of the combined signal S5 is output from a loudspeaker. For example, when, as audio reproduced from a loudspeaker, sounds of various musical instruments are simultaneously reproduced as in the case of a symphony, the above output state may arise.

Further, as shown for example in FIG. 1C, when an impulse signal of a specific single frequency in which the amplitude of the signal gradually decreases is input as an input audio signal S7, with respect to the waveform of an audio signal S8 output from a loudspeaker, the following capability deteriorates as the level lowers.

In any example of FIGS. 1A to 1C, regarding output from a loudspeaker, the output level of a signal of a small sound volume having small amplitude becomes smaller than the input signal level, hence the linearity of a small signal is not retained in this state. On analyzing a frequency in the state shown in FIGS. 1A to 1C, a state shown in FIG. 2 is obtained, for example. An example of FIG. 2 is the one in which the sensitivity of a fundamental wave f1 and of harmonic sounds f2 and f3, which are harmonics of the fundamental wave, is analyzed. The fundamental wave f1, whose level is high, is output with its level unchanged, whereas the harmonic sounds f2 and f3, whose levels are smaller than the fundamental wave, have output sensitivities shown by the solid lines below the original levels shown by the broken lines.

FIGS. 3A and 3B are figures showing an output characteristic from the low band to the high band at signal levels of several stages: FIG. 3A is a figure showing an ideal characteristic, and FIG. 3B is a figure showing an output characteristic of a loudspeaker in actuality. As shown in FIG. 3A, in an ideal state, four levels L1, L2, L3 and L4 are positioned at regular intervals and have a flat characteristic from the low band to the high band. On this occasion, an output characteristic of an actual loudspeaker shown in FIG. 3B is as follows: regarding the levels L1, L2 and L3, which are high in output level, almost the same output characteristics as the ideal characteristic are secured; however, regarding the characteristic of the level L4 which is the lowest, it is recognized that the level is lower than an originally required level by a sensitivity α in any frequency band.

FIG. 4 is an input-output characteristic diagram in which such decrease in sensitivity is seen as a characteristic at a specific frequency. As shown in FIG. 4, originally there needs to have a characteristic x shown by the broken line, in which an output level increases linearly as a signal level input to a loudspeaker increases; whereas in actuality there is a characteristic y shown by the curved line, in which above a certain level the level changes almost linearly but output sensitivity with respect to input is considerably unfavorable below a certain level due to a diaphragm less functioning with respect to input.

Specifically, when the maximum level of listening by a typical loudspeaker is assumed to be, for example, 70 to 100 dBspl (sound pressure level), a signal 30 to 60 dB lower than the maximum level will not become (will not be in proportion to) a sound volume accurately 30 to 60 dB lower than the maximum level. If reproduction is assumed to have an output sound volume of an amplifier by 50 dBspl lower than 100 dBspl, a sound volume with 50 dBspl or so can originally be obtained, but in actuality only an output of 40 dBspl that is 10 dBspl lower than that, may be obtained, for example. In other words, it is analyzed and studied by the inventor of the present invention that linearity is inaccurate to be a major cause of the problem in which unsatisfactory sound quality is obtained.

Note that the characteristics explained above are those in the case of a loudspeaker unit with a relatively large diaphragm, capable of outputting a relatively large sound volume; however, on the contrary, in the case of a loudspeaker unit whose diaphragm is small and light-weighted and which is manufactured for outputting a small sound volume such as a loudspeaker unit for a headphone, there is also an apparatus having a structure in which the linearity of an input-output characteristic is relatively favorable regarding a small sound volume, but is not retained favorably regarding a large sound volume.

SUMMARY OF THE INVENTION

The present invention is made in light of the above and provides a loudspeaker apparatus in which a reproduction characteristic of signals of small sound volumes is improved.

A loudspeaker apparatus according to an embodiment of the present invention is a loudspeaker apparatus driven by input audio signals, and includes a small-signal loudspeaker unit operable to output signals in the range of a predetermined level or below of the input audio signals, with a characteristic in which the linearity of output frequency with respect to input signals is substantially secured in the range of the predetermined level or below; and a large-signal loudspeaker unit operable to output signals in the range of a predetermined level or above of the input audio signals, with a characteristic in which the linearity of output frequency with respect to input signals is substantially secured in the range of the predetermined level or above.

Accordingly, a loudspeaker apparatus has at least two loudspeaker units, that is, a small-signal loudspeaker unit mainly suitable for vibration of small-amplitude signals and a large-signal loudspeaker unit mainly suitable for vibration of large-amplitude signals.

According to an embodiment of the present invention, a loudspeaker apparatus has a structure including at least two loudspeaker units—a small-signal loudspeaker unit mainly suitable for vibration of small-amplitude signals and a large-signal loudspeaker unit mainly suitable for vibration of large-amplitude signals. Each of the loudspeaker units has a characteristic in which linearity is substantially secured in respective ranges of the level of signals for which each loudspeaker unit functions so that signals of any level from small signals to large signals are output with a constant input-output characteristic, and reproduction sound quality therefore can be improved greatly. In particular, the reproduction characteristic of small-level signals will be improved.

In this case, since the small-signal loudspeaker unit has a suppressing mechanism to suppress vibration of a diaphragm caused by signals above a predetermined level, large-amplitude vibration caused by signals above a predetermined level is automatically suppressed by the suppressing mechanism and only signals below a predetermined level are output, enabling the small-signal loudspeaker unit to function efficiently as a small-signal loudspeaker unit.

Further, an input audio signal is divided into signals in a plurality of frequency bands, a loudspeaker unit is prepared for each of the bands formed as a result of the frequency division, and as loudspeaker units each of which outputs signals in at least one band, at least a small-signal loudspeaker unit which outputs signals below a predetermined level and a large-signal loudspeaker unit which outputs signals above a predetermined level are provided. Therefore, linearity of signals from small signals to large signals in each band can be improved in the case where a separate loudspeaker unit is prepared for each frequency band.

Further, in the case where a loudspeaker unit is thus prepared for each of the bands formed as a result of frequency division, a low band, a middle band and a high band may be formed as a result of the frequency division, and signals in the high band may be output from one loudspeaker unit, and signals in the low and middle bands may be divided and output from a small-signal loudspeaker unit and a large-signal loudspeaker unit. It is therefore possible to obtain a loudspeaker apparatus of a multiway structure in which a band having a relatively unfavorable linearity from small signals to large signals, if only one loudspeaker unit is provided, can be improved efficiently.

BRIEF DESCRIPTION OF THE DRAWINGS

FIGS. 3A and 3B are explanatory diagrams, in which FIG. 3A shows an example of an ideal output characteristic of a loudspeaker, and FIG. 3B shows an example of an output characteristic of a loudspeaker in related art.

DETAILED DESCRIPTION

Figure 5:
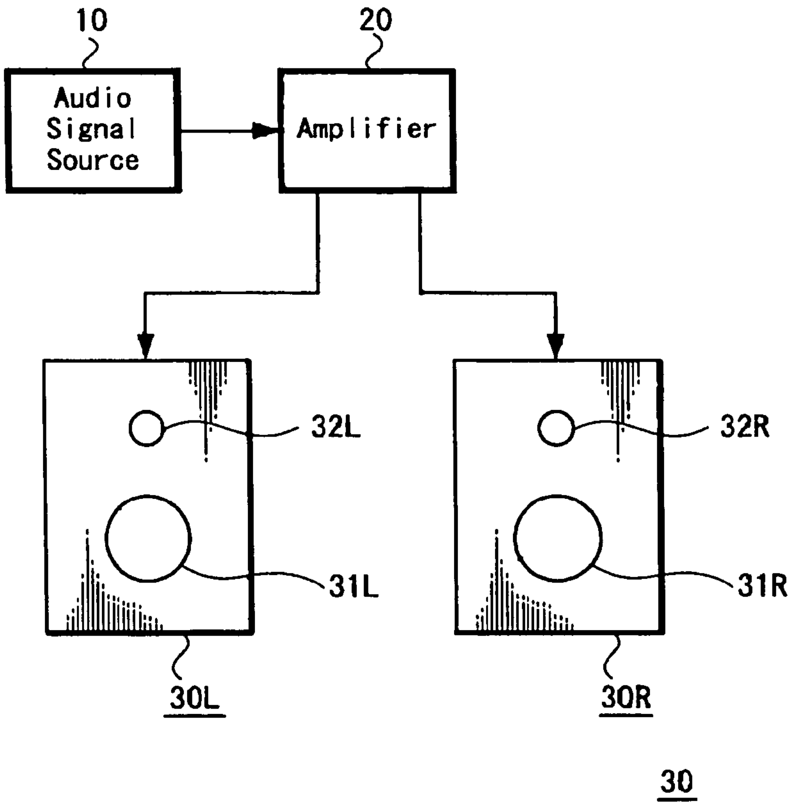
FIG. 5 is a block diagram showing an example of a system configuration according to a first embodiment of the present invention.

Hereinafter, a first embodiment of the present invention will be explained referring to FIGS. 5 to 11. FIG. 5 is a figure showing an example of a system configuration according to an embodiment of the present invention. In this embodiment, a loudspeaker apparatus is connected to an audio reproduction system, and FIG. 5 is a figure showing an example of the whole system configuration thereof. In this embodiment, an audio signal source 10 is connected to an amplifier 20, an audio signal recorded (stored) in a medium such as a CD (disc) or memory is reproduced in the audio signal source 10, and the audio signal reproduced and output is supplied to the amplifier 20 where processing of making the audio signal into an audio signal that drives the loudspeaker apparatuses is performed.

In the case of this embodiment, signals of two channels that are an audio signal for the left channel and an audio signal for the right channel are output from the audio signal source 10. An audio signal for the left channel, which is output from the amplifier 20 is supplied to a left-channel loudspeaker apparatus 30L to be output; and an audio signal for the right channel, which is output from the amplifier 20 is supplied to a right-channel loudspeaker apparatus 30R to be output.

The left-channel loudspeaker apparatus 30L and the right-channel loudspeaker apparatus 30R basically have the same structure (however, outer shapes could be symmetrical). Note that in explanations below, both the left-channel and right-channel loudspeaker apparatuses 30L and 30R are in some cases referred to as loudspeaker apparatus 30 without the symbols L and R when explanations are given with the channels distinguished. Similar explanation is applied to components in the loudspeaker apparatus 30.

As to the structure of the loudspeaker apparatuses 30L and 30R, the left-channel loudspeaker apparatus 30L includes a large-signal loudspeaker unit 31L and a small-signal loudspeaker unit 32L of loudspeaker units as acoustic output means which output audio. The right-channel loudspeaker apparatus 30R includes a large-signal loudspeaker unit 31R and a small-signal loudspeaker unit 32R of loudspeaker units as acoustic output means which output audio. Each of the loudspeaker units 31L, 31R, 32L and 32R is what is called a full-range type loudspeaker unit having, as a characteristic regarding the frequency band for the output, such a characteristic that output is performed from the low band to high band with a virtually flat frequency characteristic within the audible band. In addition, the large-signal loudspeaker units 31L and 31R are large loudspeaker units incorporating relatively large diaphragms, and the small-signal loudspeaker units 32L and 32R are small loudspeaker units incorporating relatively small diaphragms.

Specific examples of the characteristics of respective loudspeaker units are described later on; regarding a large-signal loudspeaker unit, since the diaphragm thereof is relatively large, one in which the linearity of the input-output characteristic of a large signal above a predetermined level is virtually retained is used; and regarding a small-signal loudspeaker unit, since the diaphragm thereof is relatively small, one in which the linearity of the input-output characteristic of a small signal below a predetermined level is virtually retained is used.

Since the loudspeaker apparatuses 30L and 30R each includes two loudspeaker units, namely the large-signal loudspeaker units 31L and 31R and the small-signal loudspeaker units 32L and 32R as described above, when audio signals are output from the loudspeaker apparatuses 30L and 30R, signals having large-amplitude which has a large signal level are output from the large-signal loudspeaker units 31L and 31R, and signals having small-amplitude which has a small signal level are output from the small-signal loudspeaker units 32L and 32R. The levels at which signals are output from the two loudspeaker units are divided based on a predetermined line set in advance. However, levels of output signals are not strictly divided with a predetermined level as the dividing line, but sounds output from two loudspeaker units may overlap to some extent in the vicinity of the predetermined level, for example.

Figure 6:
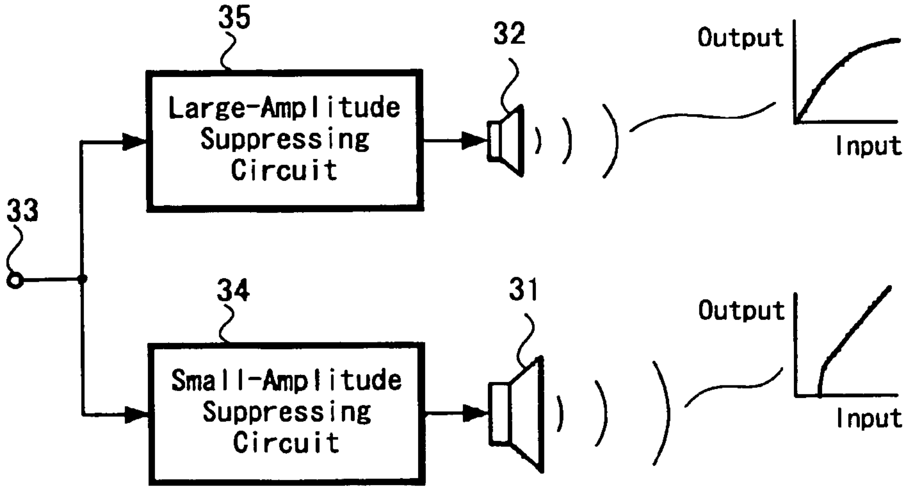
FIG. 6 is a block diagram showing an example of a configuration of a loudspeaker apparatus according to a first embodiment of the present invention.

FIG. 6 is a figure showing the connection configuration of the two loudspeaker units 31 and 32 in a loudspeaker apparatus 30. An audio signal is supplied from the side of an amplifier 20 to an input terminal 33, and the audio signal obtained at the input terminal 33 is then supplied to a small-amplitude suppressing circuit 34 and a large-amplitude suppressing circuit 35. In the small-amplitude suppressing circuit 34, small-amplitude elements below a predetermined level in an input audio signal are diminished; and in the large-amplitude suppressing circuit 35, large-amplitude elements above a predetermined level in an input audio signal are diminished.

The small-amplitude suppressing circuit 34 and the large-amplitude suppressing circuit 35 may be formed as analog circuits made of active elements or the like, or may be formed as digital circuits using digital filters or the like. Hereupon, in the case of a digital circuit, it is preferable that a signal which has not been amplified for driving a loudspeaker is input as an input audio signal and that an output from an amplitude suppressing circuit is amplified within a loudspeaker apparatus for driving a loudspeaker. In the case of an analog circuit, amplification may be executed similarly within a loudspeaker apparatus.

An audio signal whose small-amplitude signal has been suppressed (removed) in the small-amplitude suppressing circuit 34 is supplied to the large-signal loudspeaker unit 31 to be output (to emit sound). An audio signal whose large-amplitude signal has been suppressed (removed) in the large-amplitude suppressing circuit 35 is supplied to the small-signal loudspeaker unit 32 to be output (to emit sound).

Figure 7:
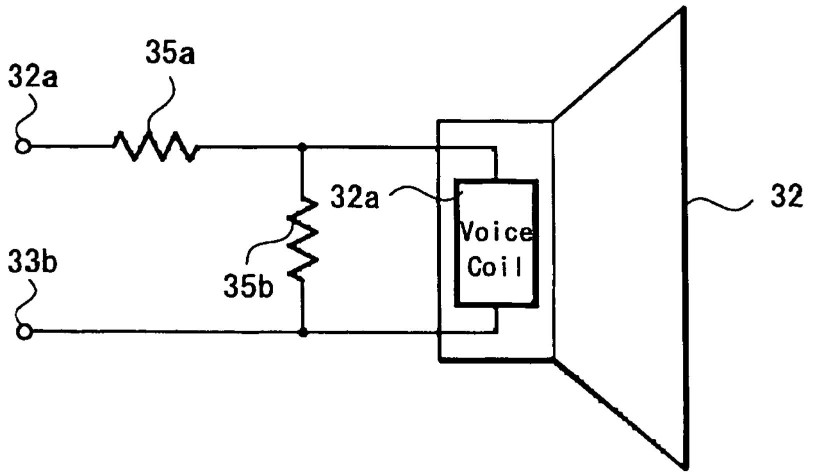
FIG. 7 is a circuit diagram showing an example of a configuration of a vibration suppressing circuit of a loudspeaker apparatus according to a first embodiment of the present invention.

FIG. 7 is a figure showing an example of a case in which a small-amplitude suppressing circuit 34 is formed of an analog circuit. An input terminal 33*a* of one polarity is connected to one end of a voice coil 32*a* of a loudspeaker unit 32 through a resistor 35*a*, and the other end of the voice coil 32*a* is connected to an input terminal 33*b* of the other polarity. Further, a resistor 35*b* is connected in parallel with the voice coil 32*a*. The resistors 35*a* and 35*b* are elements which function as a small-amplitude suppressing circuit 34. By selecting the resistance values of the resistors 35*a* and 35*b*, the level at which a small-amplitude signal is suppressed (removed) is set.

Figure 8A:
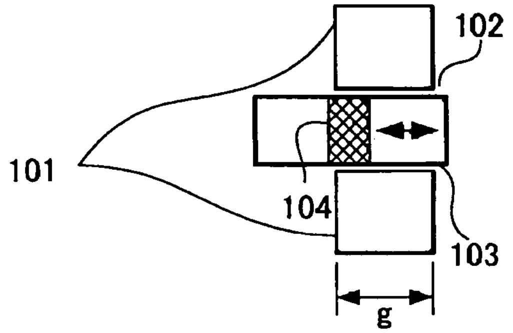
FIGS. 8A and 8B are explanatory diagrams (Example 1) showing an example of a structure of a vibrating part of a loudspeaker unit according to a first embodiment of the present invention.

FIG. 8A is a figure showing an example of a case in which a large-amplitude suppressing circuit 35 is integrally formed with a small-signal loudspeaker unit 32 with part of a magnetic circuit of the loudspeaker unit 32 being shown in cross section. In this example, a predetermined magnetic circuit 101 is included in a small-signal loudspeaker unit 32 formed as a dynamic-type loudspeaker unit, and a voice coil 104 wound on a coil bobbin to which a diaphragm (not shown in the figure) is connected is disposed in a gap 102 in the magnetic circuit 101. With this construction, an audio signal which flows through the voice coil 104 makes the voice coil 104 vibrate, the diaphragm connected vibrates, and sound is output.

Figure 8B:
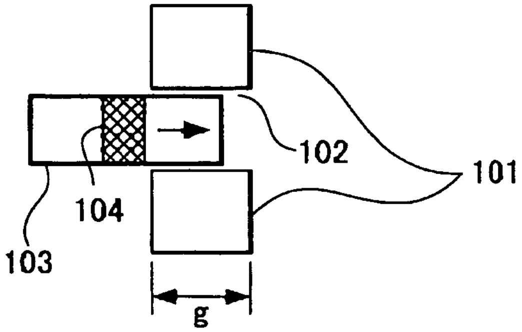

Here in this embodiment, the winding width of the voice coil 104 wound on the coil bobbin is made narrower than the width g of the gap 102. With this construction, as shown in FIG. 8B, when the voice coil 104 moves to go away from the width g of the gap 102, force with which the voice coil 104 is pulled back toward the gap 102 acts. Thus, the vibration range of the diaphragm connected to the voice coil 104 is virtually regulated by the width of the gap 102, and so if a large-amplitude audio signal is input, an output from the small-signal loudspeaker unit 32 will be only an output suppressed to be small amplitude determined by the width of the gap 102, as a result.

Figure 9:
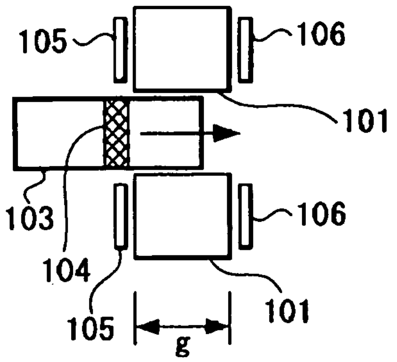
FIG. 9 is an explanatory diagram (Example 2) showing an example of a structure of a vibrating part of a loudspeaker unit according to a first embodiment of the present invention.

Further, as shown in FIGS. 8A and 8B, in the case where a gap width and the winding width of a voice coil controls a small amplitude, as shown, for example, in FIG. 9, magnetic plates 105 and 106 are disposed at one end and the other end of the magnetic circuit 101 to make each voice coil 104 generate in the gap 102 a magnetic field in the direction opposite to a magnetic field generated in a magnetic circuit 101. With this construction, in the case where the voice coil 104 moves (vibrates) to go away from the gap 102, the voice coil 104 is pulled back toward the gap 102 by means of a magnetic field generated by the magnetic plate 105 or 106 adjacent to the gap 102, so that the vibration range of a diaphragm is surely made small to be suppressed in comparison with the structure in FIGS. 8A and 8B.

Figure 10:
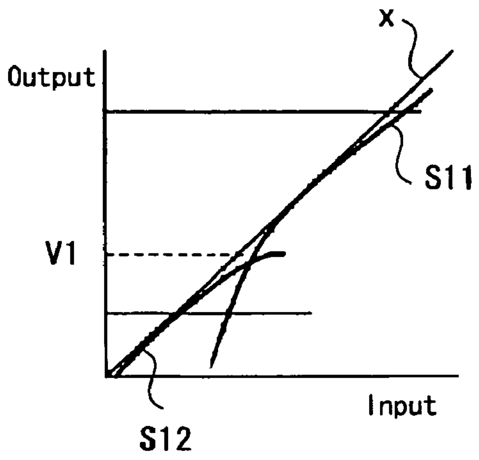
FIG. 10 is an explanatory diagram showing an example of a characteristic of a loudspeaker unit according to a first embodiment of the present invention.

FIG. 10 shows an example of the input-output characteristic of an audio signal of the loudspeaker apparatus 30 including the large-signal loudspeaker unit 31 and the small-signal loudspeaker unit 32. FIG. 10 shows a measurement result of an input-output characteristic of a specific frequency, however, basically almost the same characteristic is seen in any frequency within the output bands of the loudspeaker units 31 and 32. As shown in FIG. 10, regarding the output characteristic S12 of the small-signal loudspeaker unit 32, signals at a level lower than a predetermined level V1 are output, and almost no signals are output at a level higher than the predetermined level V1. As for the output characteristic S11 of the large-signal loudspeaker unit 31, an input-output characteristic close to an ideal input-output characteristic x is obtained at a level higher than the predetermined level V1, and there is almost no output at a level lower than the predetermined level V1.

In this case, since the small-signal loudspeaker unit 32 has a structure suitable for small-level output, the input-output characteristic at a level lower than the predetermined level V1 becomes close to the ideal input-output characteristic x, and since the large-signal loudspeaker unit 31 has a structure suitable for large-level output, the input-output characteristic at levels higher than the predetermined level V1 becomes close to the ideal input-output characteristic x.

Figure 1A:
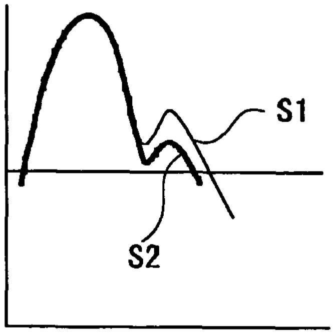
FIG. 1A (RELATED ART)
FIGS. 1A to 1C are explanatory diagrams showing examples of an output waveform of a loudspeaker in related art.
Figure 1B:
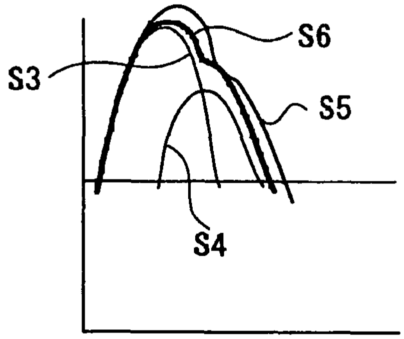
FIG. 1B (RELATED ART)
Figure 1C:
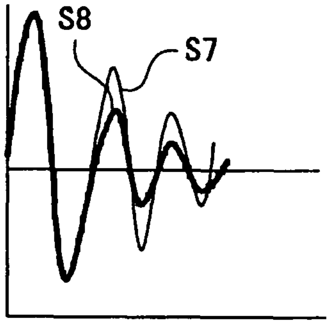
FIG. 1C (RELATED ART)
Figure 2:
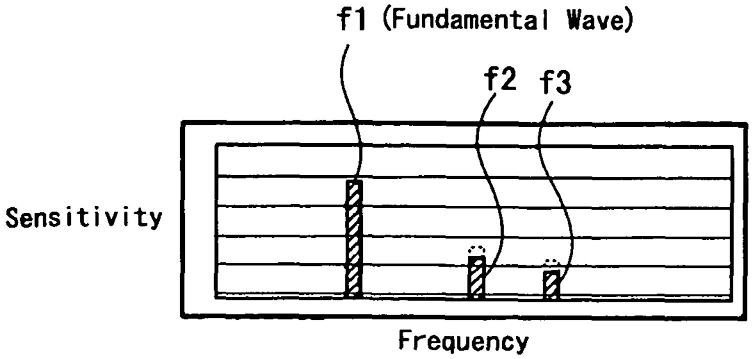
FIG. 2 (RELATED ART)
FIG. 2 is an explanatory diagram showing an example of a signal level of a loudspeaker in related art.
Figure 3A:
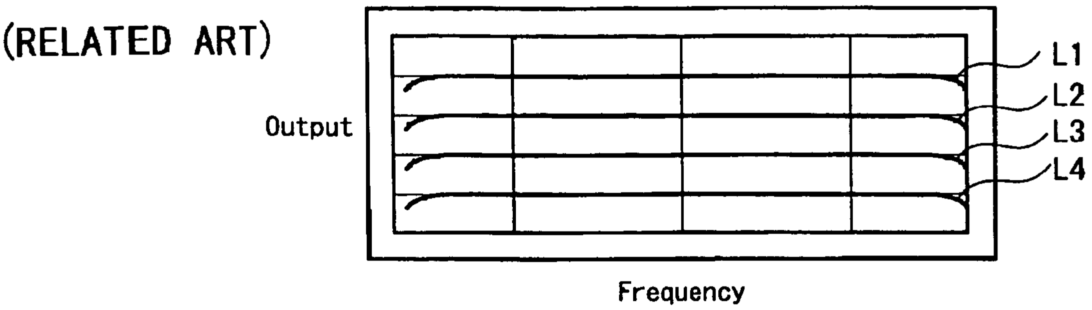
FIG. 3A (RELATED ART)
Figure 3B:
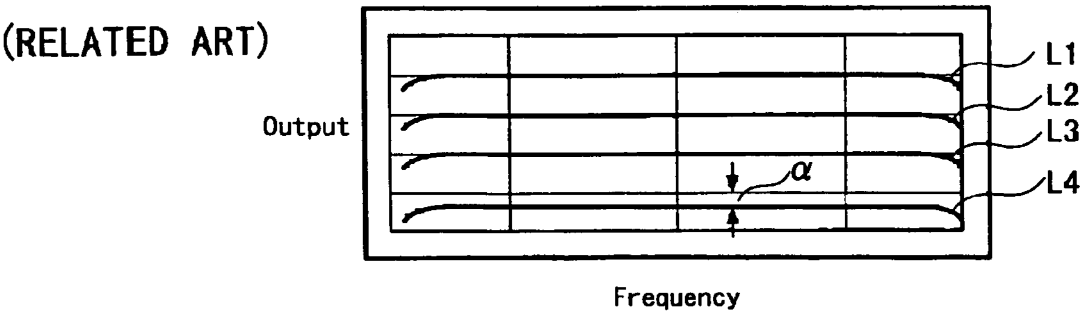
FIG. 3B (RELATED ART)
Figure 4:
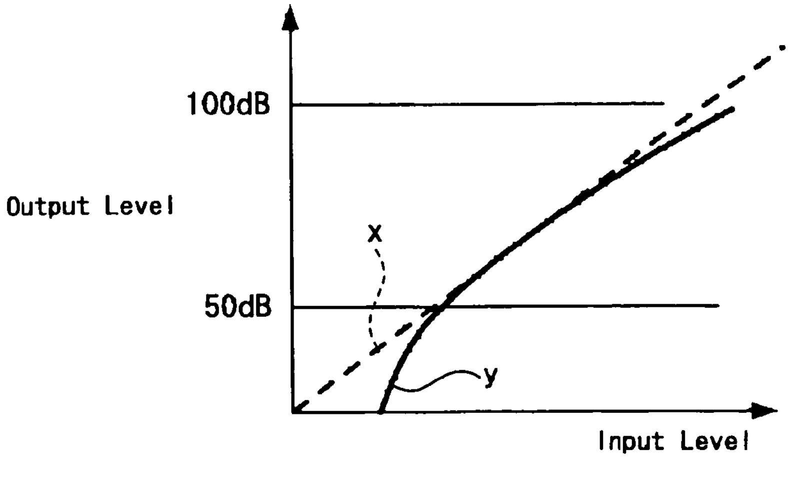
FIG. 4 (RELATED ART)
FIG. 4 is an explanatory diagram showing an example of an input-output characteristic of a loudspeaker in related art.

Therefore, the overall characteristic of a loudspeaker apparatus including the two loudspeaker units 31 and 32 combined for large signals and small signals is approximately equal to the ideal input-output characteristic x, in which the relation between input and output changes linearly, with respect to signals at any level from small-level signals to large-level signals, hence an excellent output characteristic in which the linearity of input and output is retained as regards signals at any level from small-level signals to large-level signals. The above characteristic, in which the linearity of input and output is retained as regards signals at any level from small-level signals to large-level signals, is extremely difficult to be obtained in the case where signals at all levels from small-level signals to large-level signals are output with one loudspeaker unit, however an excellent characteristic is secured in this embodiment. The output characteristic of the loudspeaker apparatus of this embodiment is close to the ideal characteristic in FIG. 3A referred to in explaining background art.

In addition, regarding the arrangement of two loudspeaker units 31 and 32 for large signals and small signals, the two units may be positioned vertically inside one loudspeaker box constituting the loudspeaker apparatus 30, however, when the two loudspeaker units 31 and 32 are arranged as closely as possible, the position of a sound source where sound is output from a loudspeaker apparatus will be converged, which is preferable for a loudspeaker.

Figure 11:
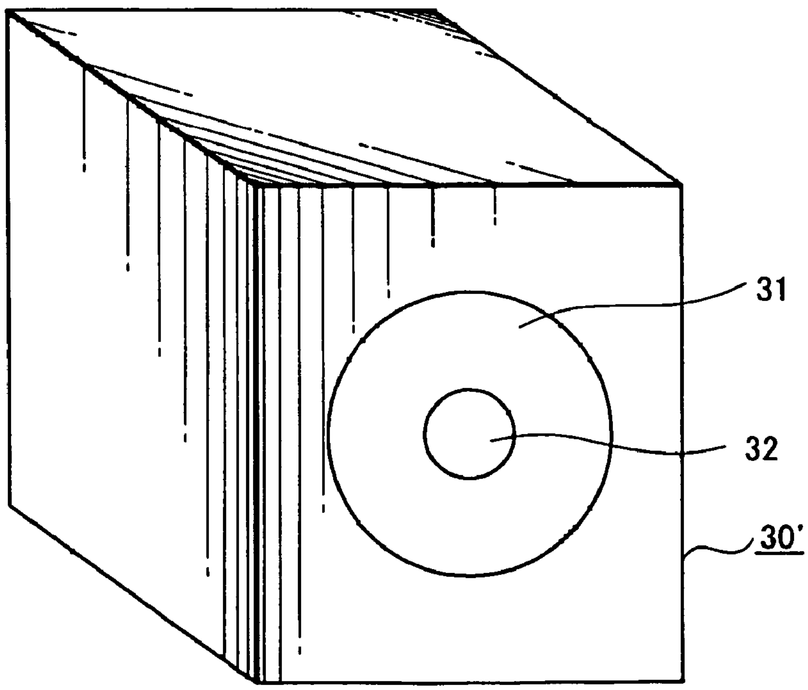
FIG. 11 is a perspective view showing an example in which units of a loudspeaker apparatus according to a first embodiment of the present invention are coaxially arranged.

As shown, for example, in FIG. 11, a loudspeaker apparatus 30' in which a large-signal loudspeaker unit 31 and a small-signal loudspeaker unit 32 are coaxially arranged may be provided. In this case, diaphragms of both loudspeaker units may be positioned not to interfere with each other by arranging, for example, the small-signal loudspeaker unit 32 in front of the large-signal loudspeaker unit 31.

Further, in the case of a loudspeaker apparatus for an audio system arranged in a vehicle such as an automobile, a large-signal loudspeaker unit 31 and a small-signal loudspeaker unit 32 may be arranged at different positions. For example, a relatively small small-signal loudspeaker unit 32 may be arranged at a mirror cell, pillar, dashboard or the like in a vehicle in the vicinity of a listener (driver) and a relatively large large-signal loudspeaker unit 31 may be arranged at a position where space for installation can be secured, for example in a door.

Figure 12:
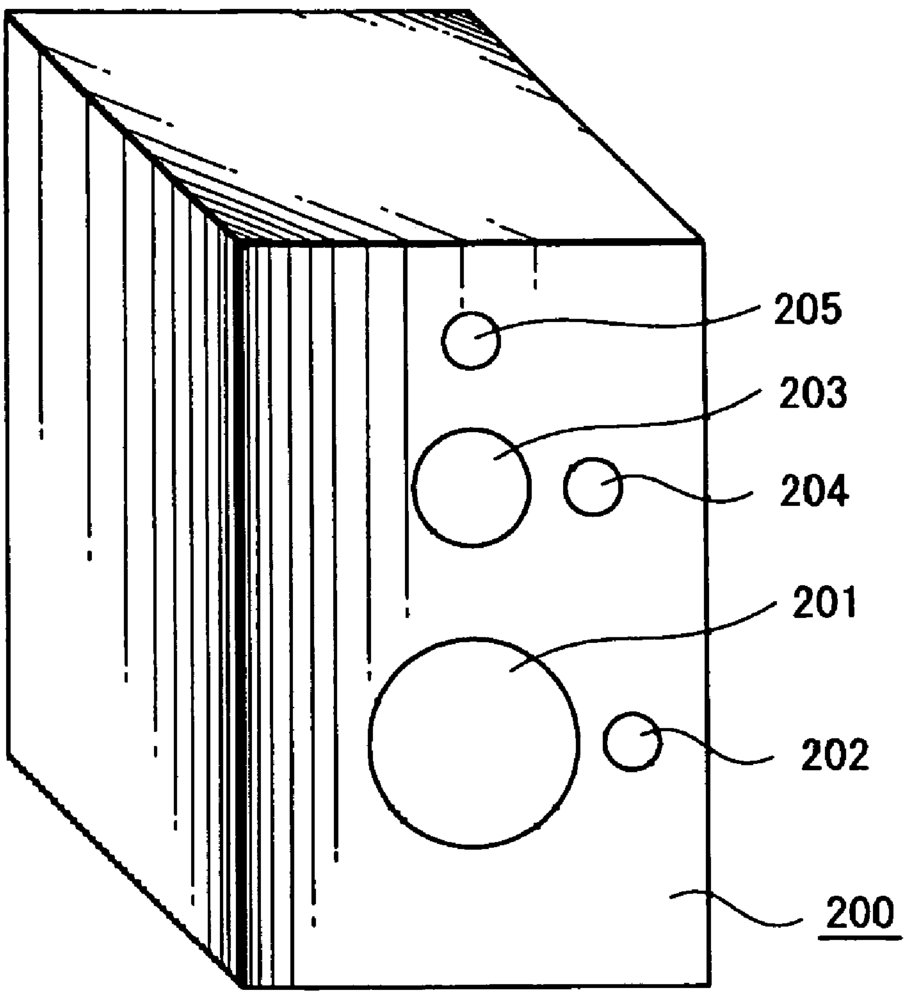
FIG. 12 is a constitutional diagram showing an example of a case in which a loudspeaker apparatus according to a second embodiment of the present invention has a three-way structure.

Next, a second embodiment of the present invention is explained referring to FIGS. 12 and 13. In this embodiment, similarly to the above-described first embodiment, a loudspeaker apparatus is connected to an audio reproduction system and is used having a system configuration shown, for example, in FIG. 5.

FIG. 12 is a figure showing the structure of a loudspeaker apparatus 200 of this embodiment. In the case of a structure having two channels as shown in FIG. 5, two loudspeaker apparatus 200 are used. In this embodiment, as a loudspeaker apparatus 200, a loudspeaker apparatus of what is called a three-way structure including a low-band loudspeaker unit, middle-band loudspeaker unit and high-band loudspeaker unit is provided.

For the low-band loudspeaker unit, a low-band large-signal loudspeaker unit 201 and a low-band small-signal loudspeaker unit 202 are prepared, and for the middle-band loudspeaker unit, a middle-band large-signal loudspeaker unit 203 and a middle-band small-signal loudspeaker unit 204 are prepared. The high-band loudspeaker unit has a structure in which signals at all levels from large signals to small signals are output with one high-band loudspeaker unit 205. In an example of the structure shown in FIG. 12, the low-band loudspeaker unit, middle-band loudspeaker unit and high-band loudspeaker unit are arranged in this order from the bottom, and further, the large-signal unit and small-signal unit are horizontally disposed in respective bands, however, this unit arrangement is one example, and the present invention is not limited to this arrangement. Further, all the units may not be integrally housed in one casing constituting the loudspeaker apparatus 200, and the units may be housed in a plurality of casings. Furthermore, in the case of an in-vehicle audio reproduction system, loudspeaker units may be arranged at various positions in a vehicle such that a listener such as a driver can listen to optimally.

As regards a structure in which an input audio signal is divided into three bands of the low band, middle band and high band, a structure typically applied to a loudspeaker apparatus of a three-way structure in which band division is performed, for example, by means of filters for respective bands, or the like, is applicable. Regarding the three bands, the low band, middle band and high band, as well, bands typically used are applicable.

Regarding an input audio signal in the low band and an input audio signal in the middle band on which band division is performed, the structure in FIG. 6 explained in the above-mentioned first embodiment is applied and each input audio signal is divided into a large signal above a predetermined level and a small signal below the predetermined level, and then those signals are supplied to corresponding loudspeaker units. Specifically, a large signal in the low band is supplied to the low-band large-signal loudspeaker unit 201 to be output, and a small signal in the low band is supplied to the low-band small-signal loudspeaker unit 202 to be output. A large signal in the middle band is supplied to the middle-band large-signal loudspeaker unit 203 to be output, and a small signal in the middle band is supplied to the middle-band small-signal loudspeaker unit 204 to be output.

Figure 13A:
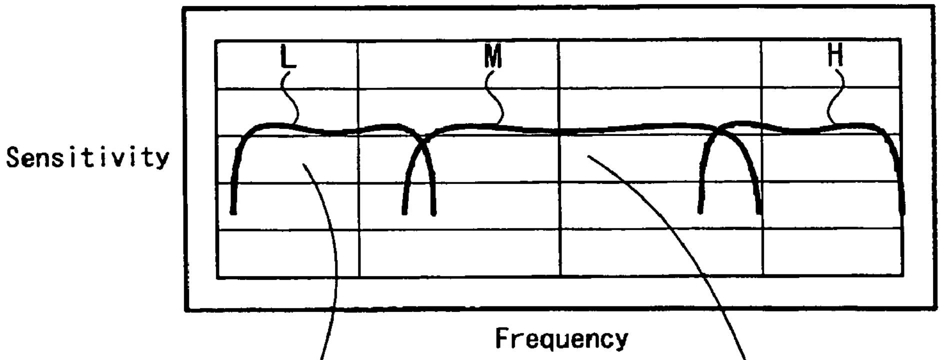
FIGS. 13A to 13C are explanatory diagrams showing an example of a characteristic in the case where the example of FIG. 12 is made into the three-way structure.
Figure 13B:
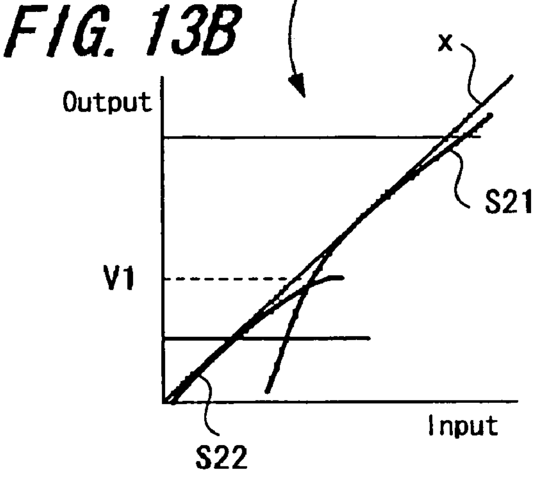
Figure 13C:
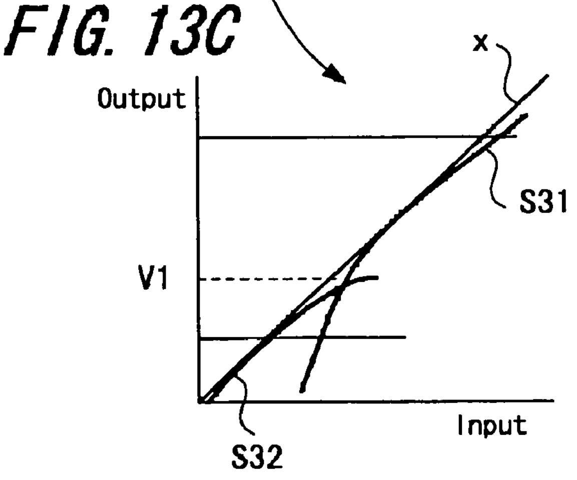

FIGS. 13A to 13C are figures showing an example of the output characteristic of a loudspeaker apparatus of this embodiment. As shown in FIG. 13A, regarding sensitivity according to frequency, there are three divided bands of the low band L, middle band M and high band H. Signals of the low band L are output from the low-band large-signal loudspeaker unit 201 and from the low-band small-signal loudspeaker unit 202. Signals of the middle band M are output from the middle-band large-signal loudspeaker unit 203 and from the middle-band small-signal loudspeaker unit 204. Signals of the high band H are output from the high-band loudspeaker unit 205.

Here, regarding the low band L, as shown in FIG. 13B, since the low-band large-signal loudspeaker unit 201 with a characteristic S21 in which signals virtually above a predetermined level V1 are output and the low-band small-signal loudspeaker unit 202 with a characteristic S22 in which signals virtually below the predetermined level V1 are output are provided separately, a characteristic close to an ideal linear characteristic x can be obtained as an overall input-output characteristic in the low band.

Regarding the middle band M as well, as shown in FIG. 13C, since the middle-band large-signal loudspeaker unit 203 with a characteristic S31 in which signals virtually above a predetermined level V1 are output and the middle-band small-signal loudspeaker unit 204 with a characteristic S32 in which signals virtually below the predetermined level V1 are output are provided separately, a characteristic close to an ideal linear characteristic x can be obtained as an overall input-output characteristic in the middle band.

According to the loudspeaker apparatus 200 of a three-way structure thus constructed, the band for which each loudspeaker unit functions may be narrow in comparison with a full-range type loudspeaker apparatus and a loudspeaker unit with a favorable characteristic is used for each band, and so a favorable characteristic of a loudspeaker apparatus of a three-way structure can be secured; and furthermore, in this embodiment, regarding the low and middle bands, a loudspeaker unit is divided into a large-signal one and a small-signal one, so that the linearity of input-output characteristics in the low and middle bands is secured, and a loudspeaker apparatus of a further favorable characteristic can be obtained.

It should be noted that although signals from small signals to large signals are output from one loudspeaker unit with respect to the high band in an example of the structure in FIG. 12, a large-signal loudspeaker unit and a small-signal loudspeaker unit may be separately provided regarding a loudspeaker unit of the high band, similarly to the other bands. However, regarding a loudspeaker unit of the high band, a diaphragm is relatively small and light-weighted and the input-output characteristic is relatively favorable, and so even if there is only one loudspeaker unit for the high band as in the structure shown in FIG. 12, a relatively favorable characteristic can be secured.

Note that as shown in FIGS. 13A to 13C, the predetermined level V1 in the low band, which divides a level of loudspeaker unit into the two loudspeaker units 201 and 202, and the predetermined level V1 in the middle band, which divides a level of a loudspeaker unit into the two loudspeaker units 203 and 204, may be selected depending on the characteristic of the loudspeaker unit in each band, and are not necessarily the same.

Note that although in the second embodiment shown in FIGS. 12 and 13 a three-way structure is used as the structure of a loudspeaker apparatus, a loudspeaker apparatus of a two-way structure in which loudspeaker units for the low band and high band are separately provided may also be provided, wherein two loudspeaker units in which sound pressure is divided into a level above a predetermined level and below the predetermined level may be provided with respect to only a loudspeaker unit of the low band or both loudspeaker units of the low and high bands.

Further, although the application to the audio reproduction system having two channels shown in FIG. 5 is assumed in the above-mentioned embodiments, a loudspeaker apparatus for multichannel audio reproduction such as the 5.1 channel may also be constructed. In the case of the multichannel reproduction system, when the above-mentioned loudspeaker apparatus of a sound pressure division type is, for example, selected for a loudspeaker apparatus used as a center loudspeaker, there will be effectiveness with which sound can be made clear with a feeling of expansion remaining.

Further, the specific structure of large-signal and small-signal loudspeaker units was not particularly explained in the above-mentioned embodiments; loudspeaker units of various structures suitable for reproducing respective signal levels are applicable. Specifically, both large-signal and small-signal loudspeaker units may be dynamic-type loudspeaker units, which are loudspeaker units of a typical structure, however, a condenser-type loudspeaker unit may be used for a small-signal loudspeaker unit, for example.

It should be understood by those skilled in the art that various modifications, combinations, sub-combinations and alterations may occur depending on design requirements and other factors insofar as they are within the scope of the appended claims or the equivalents thereof.

The invention claimed is:

1. A loudspeaker apparatus driven by input audio signals, comprising:

a small-signal loudspeaker unit operable to output signals in a range of a predetermined level or below of the input audio signals, with a characteristic in which a linearity of output frequency with respect to input signals is substantially secured in the range of the predetermined level or below; and a large-signal loudspeaker unit operable to output signals in a range of a predetermined level or above of the input audio signals, with a characteristic in which the linearity of output frequency with respect to input signals is substantially secured in the range of the predetermined level or above, the small-signal loudspeaker unit includes first suppressing means for suppressing large amplitude elements of the predetermined level or above of the input audio signals such that vibration of a small diaphragm of the small-signal loudspeaker unit which may otherwise have been caused therefrom are suppressed, and the large-signal loudspeaker unit includes second suppressing means for suppressing small amplitude elements of the predetermined level or below of the input audio signals such that vibration of a large diaphragm of the large-signal loudspeaker unit which may otherwise have been caused therefrom are suppressed.

2. A loudspeaker apparatus according to claim 1, wherein the input audio signals are divided according to frequency into signals in a plurality of frequency bands, and a loudspeaker unit is prepared for each of the frequency bands, and as a loudspeaker unit which outputs signals in at least one of the frequency bands, the small-signal loudspeaker unit which outputs signals of the predetermined level or below and the large-signal loudspeaker unit which outputs signals of the predetermined level or above are provided.

3. A loudspeaker apparatus according to claim 2, wherein the plurality of frequency bands includes a low band, a middle band and a high band, the output of the high band is performed from one loudspeaker unit, and the output of the low and middle bands is divided and performed from a small-signal loudspeaker unit and a large-signal loudspeaker unit, respectively.

4. A loudspeaker apparatus driven by input audio signals, comprising:

a small-signal loudspeaker unit operable to output signals in a range below a predetermined level of the input audio signals, with a characteristic in which a linearity of output frequency with respect to the input signals is substantially secured in the range below the predetermined level; and a large-signal loudspeaker unit operable to output signals in a range above the predetermined level of the input audio signals, with a characteristic in which a linearity of output frequency with respect to the input signals is substantially secured in the range above the predetermined level, the small-signal loudspeaker unit includes first suppressing means for suppressing large amplitude elements above the predetermined level of the input audio signals such that vibration of a small diaphragm of the small-signal loudspeaker unit which may otherwise have been caused therefrom are suppressed, and the large-signal loudspeaker unit includes second suppressing means for suppressing small amplitude elements below the predetermined level of the input audio signals such that vibration of a large diaphragm of the large-signal loudspeaker unit which may otherwise have been caused therefrom are suppressed.

* * * * *